(12) United States Patent
Sowlati et al.

(10) Patent No.: US 9,065,387 B2
(45) Date of Patent: Jun. 23, 2015

(54) SYSTEMS AND METHODS FOR MAINTAINING POWER AMPLIFIER PERFORMANCE

(71) Applicant: BROADCOM CORPORATION, Irvine, CA (US)

(72) Inventors: Tirdad Sowlati, Irvine, CA (US); Ehsan Adabi, Newport Beach, CA (US); Sayedfarid Shirinfar, Los Angeles, CA (US); Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 119 days.

(21) Appl. No.: 13/714,298

(22) Filed: Dec. 13, 2012

(65) Prior Publication Data
US 2014/0152391 A1 Jun. 5, 2014

Related U.S. Application Data

(60) Provisional application No. 61/732,819, filed on Dec. 3, 2012.

(51) Int. Cl.
| | |
|---|---|
| H03G 3/20 | (2006.01) |
| H03F 1/02 | (2006.01) |
| H03F 3/195 | (2006.01) |
| H03F 3/21 | (2006.01) |
| H03F 3/24 | (2006.01) |

(52) U.S. Cl.
CPC .............. *H03F 1/0272* (2013.01); *H03G 3/20* (2013.01); *H03F 3/195* (2013.01); *H03F 3/211* (2013.01); *H03F 3/24* (2013.01); *H03F 2200/105* (2013.01); *H03F 2200/405* (2013.01); *H03F 2200/78* (2013.01)

(58) Field of Classification Search
CPC ...................................... H03F 1/0222
USPC ................... 330/51, 136, 140, 285, 296, 297
See application file for complete search history.

(56) References Cited

U.S. PATENT DOCUMENTS 7,394,318 B2 * 7/2008 Mason .......................... 330/285

* cited by examiner

*Primary Examiner* — Robert Pascal
*Assistant Examiner* — Khiem Nguyen
(74) *Attorney, Agent, or Firm* — McDermott Will & Emery LLP

(57) ABSTRACT

Systems and methods for maintaining power amplifier performance are provided. A system includes a bias supply that generates a bias voltage, and at least one primary power amplifier (PA) that receives the bias voltage and a primary radio frequency (RF) input. The at least one primary PA amplifies the primary RF input based on the bias voltage. The system includes an auxiliary PA that is connected in parallel with the at least one primary PA and receives the bias voltage and an auxiliary RF input, which is a scaled version of the primary RF input. The auxiliary PA amplifies the auxiliary RF input based on the bias voltage. The system includes a detector that measures an output voltage associated with the amplified auxiliary RF input, and a comparator that compares the measured output voltage to a reference voltage. The bias supply adjusts the bias voltage based on the comparison.

20 Claims, 5 Drawing Sheets

SYSTEMS AND METHODS FOR MAINTAINING POWER AMPLIFIER PERFORMANCE

CROSS-REFERENCES TO RELATED APPLICATIONS

The present application claims the benefit of U.S. Provisional Patent Application Ser. No. 61/732,819, titled "Systems and Methods for Maintaining Power Amplifier Performance," filed on Dec. 3, 2012, which is hereby incorporated by reference in its entirety for all purposes.

FIELD

The subject technology generally relates to power amplifiers and, in particular, relates to systems and methods for maintaining power amplifier performance.

BACKGROUND

A power amplifier may be used to increase the power of a signal. The degree of amplification of the signal may vary depending on the amount of voltage that the power amplifier is biased with. For example, a higher bias voltage may result in a greater amplification of the signal. However, the performance of the power amplifier may be degraded over time and/or repeated use. As a result, the power amplifier may not be able to increase the power of the signal to its intended degree.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology.

DETAILED DESCRIPTION

In the following detailed description, numerous specific details are set forth to provide a full understanding of the subject technology. It will be apparent, however, that the subject technology may be practiced without some of these specific details. In other instances, structures and techniques have not been shown in detail so as not to obscure the subject technology.

Figure 1:
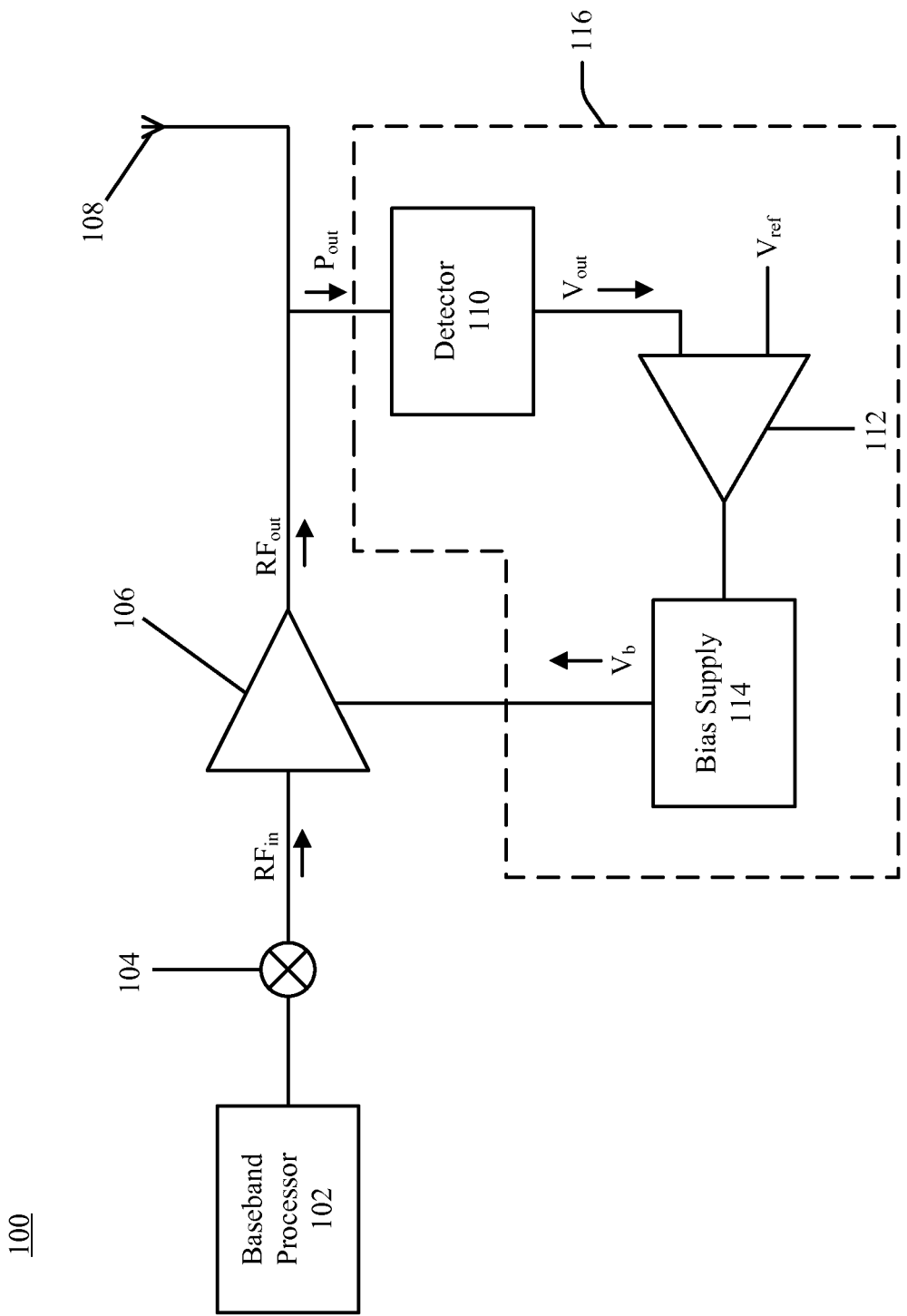
FIG. 1 illustrates an example of a transmission system, in accordance with various aspects of the subject technology.

FIG. 1 illustrates an example of transmission system 100, in accordance with various aspects of the subject technology. In one or more implementations, transmission system 100 may be part of a communication device for facilitating the transmission of a signal to a target destination. According to certain aspects, transmission system 100 includes baseband processor 102 that generates the signal to be transmitted, mixer 104 that modulates the signal to generate a signal $RF_{in}$ for transmission, power amplifier 106 that amplifies the signal $RF_{in}$ to generate an output signal $RF_{out}$, and antenna 108 that transmits the output signal $RF_{out}$ to the target destination. According to certain aspects, the output signal $RF_{out}$ may be a radio frequency (RF) signal having millimeter waves. In some aspects, the signal $RF_{out}$ may be an RF signal having any suitable wavelength.

The performance of power amplifier 106 may become degraded over time and/or by repeated use (e.g., aging), thereby affecting its reliability. As a result, in order for power amplifier 106 to maintain its performance (e.g., in producing large voltage swings), the bias voltage of power amplifier 106 (e.g., its threshold voltage) may need to be increased. According to various aspects of the subject technology, transmission system 100 includes feedback module 116, which may provide a feedback mechanism to measure a power output $P_{out}$ of the output signal $RF_{out}$ to be transmitted, and to adjust the bias voltage provided to power amplifier 106 as needed in order to account for aging and/or for power amplifier 106 to generate the output signal $RF_{out}$ at a desired power.

Feedback module 116 includes detector 110, comparator 112, and bias supply 114. Detector 110 includes logic, code, and/or circuitry for measuring the power output $P_{out}$ of the output signal $RF_{out}$ and for providing a corresponding output voltage $V_{out}$ to comparator 112. For example, detector 110 may include a transmit signal strength indicator (TSSI) that measures the power output $P_{out}$ and provides a corresponding output voltage $V_{out}$ to comparator 112. Comparator 112 includes logic, code, and/or circuitry for comparing the output voltage $V_{out}$ to a reference voltage $V_{ref}$ and for determining a difference between the output voltage $V_{out}$ and the reference voltage $V_{ref}$. In some aspects, the reference voltage $V_{ref}$ may be predetermined. In some aspects, the reference voltage $V_{ref}$ may specify a voltage that the output signal $RF_{out}$ should have in order for power amplifier 106 to maintain its level of performance. Bias supply 114 includes logic, code, and/or circuitry for adjusting the bias voltage $V_b$ provided to power amplifier 106 based on the difference in voltage between the output voltage $V_{out}$ and the reference voltage $V_{ref}$. For example, if the output voltage $V_{out}$ is less than the reference voltage $V_{ref}$, then bias supply 114 may increase the bias voltage $V_b$ provided to power amplifier 106 so that power amplifier 106 can generate the output signal $RF_{out}$ such that its voltage substantially matches the reference voltage $V_{ref}$.

Figure 2:
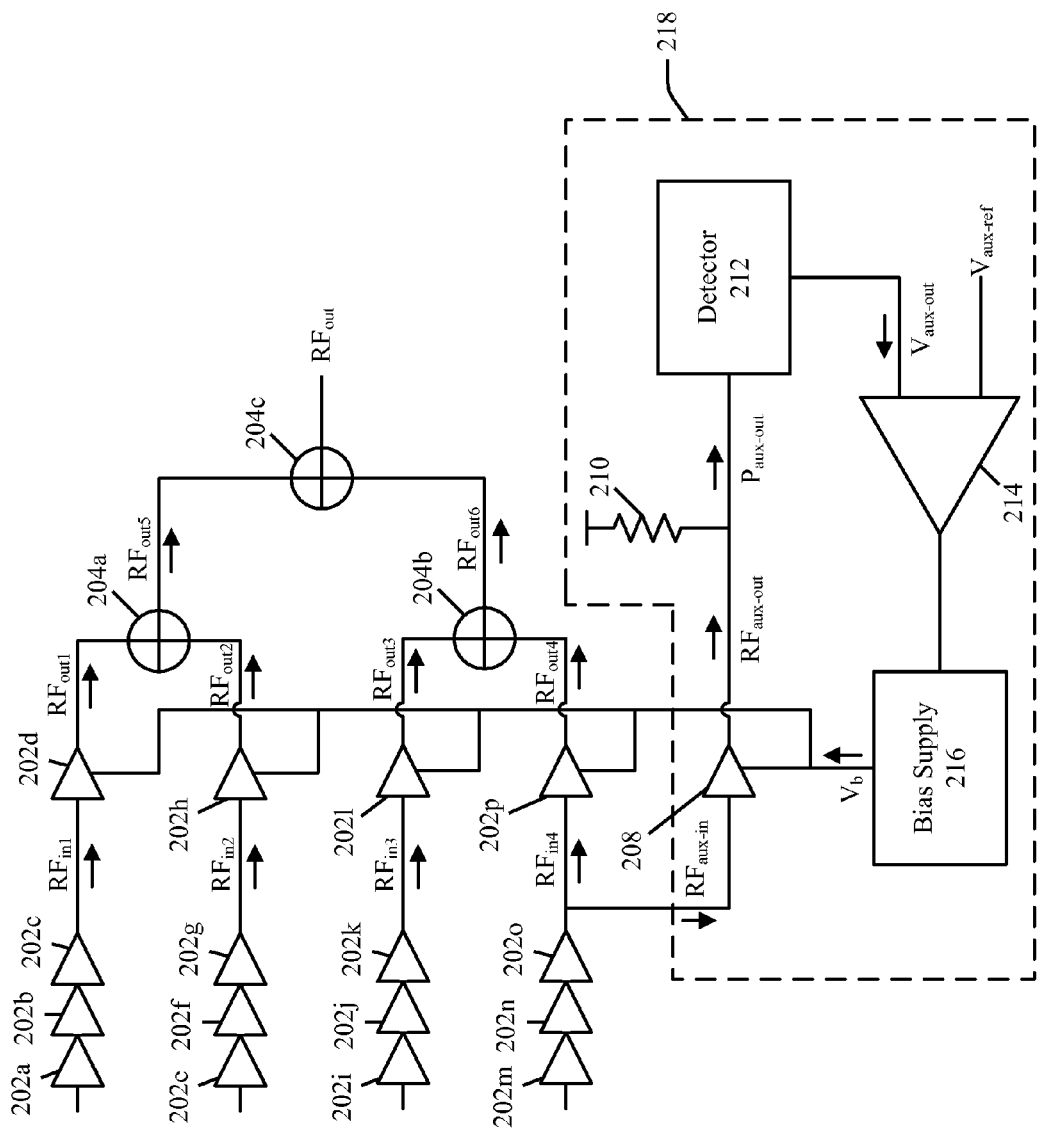
FIG. 2 illustrates an example of a plurality of power amplifiers that can be combined together to generate a voltage swing that is substantially the same as a voltage swing that can be generated by a single larger power amplifier, in accordance with various aspects of the subject technology.

Producing a large voltage swing using a single power amplifier may not always be feasible. In this regard, smaller power amplifiers (e.g., ones that produce smaller voltage swings) may be combined together to generate a voltage swing that is substantially the same as a voltage swing that can be generated by a single larger power amplifier. FIG. 2 illustrates an example of a plurality of power amplifiers 202 (e.g., power amplifiers 202a, 202b, 202c, 202d, 202e, 202f, 202g, 202h, 202i, 202j, 202k, 202l, 202m, 202n, 202o, and 202p) that can be combined together to generate a voltage swing that is substantially the same as a voltage swing that can be produced by a single larger power amplifier (e.g., power amplifier 106 in FIG. 1), in accordance with various aspects of the subject technology. In this regard, the plurality of power amplifiers 202 may be used instead of power amplifier 106 in FIG. 1 to amplify the signal $RF_{in}$.

According to certain aspects, the signal $RF_{in}$ may be divided among the plurality of power amplifiers 202 such that a set of power amplifiers 202 may each receive a portion of the signal $RF_{in}$. In one or more implementations, power amplifiers 202a, 202b, 202c, and 202d, which are cascaded, may receive and amplify a portion of the signal $RF_{in}$ (e.g., shown in FIG. 2 as $RF_{in1}$) to generate the signal $RF_{out1}$. Similarly, power amplifiers 202e, 202f, 202g, and 202h, which are cascaded, may receive and amplify a portion of the signal $RF_{in}$ (e.g., shown in FIG. 2 as $RF_{in2}$) to generate the signal $RF_{out2}$. Power amplifiers 202i, 202j, 202k, and 202l, which are cascaded, may receive and amplify a portion of the signal $RF_{in}$ (e.g., shown in FIG. 2 as $RF_{in3}$) to generate the signal $RF_{out3}$. Furthermore, power amplifiers 202m, 202n, 202o, and 202p, which are cascaded, may receive and amplify a portion of the signal $RF_{in}$ (e.g., shown in FIG. 2 as $RF_{in4}$) to generate the signal $RF_{out4}$.

As shown in FIG. 2, the cascaded sets of power amplifiers 202 are connected in parallel with one another. For example, power amplifiers 202a, 202b, 202c, and 202d are connected in parallel with power amplifiers 202e, 202f, 202g, and 202h. Power amplifiers 202i, 202j, 202k, and 202l are connected in parallel with power amplifiers 202m, 202n, 202o, and 202p. According to certain aspects, summer 204a may combine the signals $RF_{out1}$ and $RF_{out2}$ to generate the signal $RF_{out5}$, while summer 204b may combine the signals $RF_{out3}$ and $RF_{out4}$ to generate the signal $RF_{out6}$. Summer 204c may then combine the signals $RF_{out5}$ and $RF_{out6}$ to generate the output signal $RF_{out}$ for transmission.

Aging may also affect the performance of the plurality of power amplifiers 202. In this regard, feedback module 116 in FIG. 1 may be used to measure a power output $P_{out}$ of the output signal $RF_{out}$ to be transmitted, and to adjust the bias voltage provided to the plurality of power amplifiers 202 as needed in order to account for aging and/or for the plurality of power amplifiers 202 to generate the output signal $RF_{out}$ at a desired power. However, measuring the power output $P_{out}$ of the output signal $RF_{out}$ may sometimes affect the output signal $RF_{out}$ itself, which may lead to inaccuracies in determining the amount of bias voltage to provide to the plurality of power amplifiers 202. In this regard, feedback module 218 provides a feedback mechanism to accurately adjust the bias voltage without necessarily affecting the output signal $RF_{out}$. In this regard, feedback module 218 may be used instead of feedback module 116 in FIG. 1 to provide feedback for adjusting the bias voltage $V_b$. In some aspects, feedback module 218 may be an alternative and simple implementation of feedback module 116 in FIG. 1.

Since aging may primarily affect the last stage of power amplifiers 202 (e.g., power amplifiers 202d, 202h, 202l, and 202p), feedback module 218 may be used to provide feedback for adjusting the bias voltage $V_b$ provided to these power amplifiers. Feedback module 218 includes auxiliary power amplifier 208, auxiliary output load resistor 210, detector 212, comparator 214, and bias supply 216. Auxiliary power amplifier 208 is connected in parallel with the last stage of power amplifiers 202 and provides a mechanism to mimic the aging process of the last stage of power amplifiers 202 without contributing to the output signal $RF_{out}$. Thus, the feedback mechanism provided by feedback module 218 may measure an auxiliary power output $P_{aux-out}$ of auxiliary power amplifier 208, and may adjust the bias voltage $V_b$ provided to the last stage of power amplifiers 202 as needed in order to account for aging and/or for the plurality of power amplifiers 202 to generate the output signal $RF_{out}$ at a desired power.

According to certain aspects, auxiliary power amplifier 208 receives an auxiliary signal $RF_{aux-in}$. According to certain aspects, the auxiliary signal $RF_{aux-in}$ may be a scaled version of the signal $RF_{in}$. In one or more implementations, the auxiliary signal $RF_{aux-in}$ may scale the signal $RF_{in}$ by a scale factor. In some aspects, the scale factor may be given by 1/N, where N is a total number of the plurality of power amplifiers 202 (e.g., in the last stage). For example, suppose N is 100 (e.g., there are a total of 100 power amplifiers in the last stage). Thus, a magnitude of the auxiliary signal $RF_{aux-in}$ may be 1/100 of a magnitude of the signal $RF_{in}$. In other words, if a current amplitude of the signal $RF_{in}$ were 1 milliamp, a current amplitude of the auxiliary signal $RF_{aux-in}$ may be 0.01 milliamps. In some aspects, auxiliary power amplifier 208 may be a scaled version of any one of the last stage of power amplifiers 202, which may contribute to the scaling of the auxiliary signal $RF_{aux-in}$. For example, auxiliary power amplifier 208 may be a scaled version of any one of the last stage of power amplifiers 202 by an amplifier factor M (e.g., M may be less than 1). Thus, according to certain aspects, the scale factor may be given by M/N.

In some aspects, the auxiliary signal $RF_{aux-in}$ may be scaled depending on an output load connected to auxiliary power amplifier 208. As shown in FIG. 2, auxiliary power amplifier 208 is coupled to auxiliary output load resistor 210. A value for auxiliary output load resistor 210 may be selected such that auxiliary power amplifier 208 receives the scaled version of the signal $RF_{in}$ by the scale factor (e.g., the auxiliary signal $RF_{aux-in}$). In one or more implementations, auxiliary output load resistor 210 is a scaled version of an output load coupled to the last stage of power amplifiers 202 by an inverse of the scale factor (e.g., 100). For example, suppose the last stage of power amplifiers 202 encounters an output load of 10 ohms (e.g., the last stage of power amplifiers "sees" 10 ohms in the direction of the output signal $RF_{out}$). Thus, the auxiliary output load resistor 210 may have a value of 1000 ohms. Although the scale factor is described as being 1/100 and auxiliary output load resistor is described as being 1000 ohms, it is understood that the scale factor and/or auxiliary output load resistor may have any value that can scale the signal $RF_{in}$ to generate the auxiliary signal $RF_{aux-in}$.

Auxiliary power amplifier 208 may amplify the auxiliary signal $F_{aux-in}$ to generate an auxiliary output signal $RF_{aux-out}$. The voltage swing of the auxiliary output signal $RF_{aux-out}$ may be substantially the same as the voltage swing of any of the outputs of the last stage of power amplifiers (e.g., the signal $RF_{out1}$, the signal $RF_{out2}$, the signal $RF_{out3}$, and/or the signal $RF_{out4}$). Thus, the aging of auxiliary power amplifier 208 may be similar to the aging of any one of the last stage of power amplifiers. In this regard, feedback may be based on the auxiliary output signal $RF_{aux-out}$ rather than the outputs of the last stage of power amplifiers, thereby minimizing the possibility of affecting the output signal $RF_{out}$.

Detector 212 includes logic, code, and/or circuitry for measuring an auxiliary power output $P_{aux-out}$ of the auxiliary signal $RF_{aux-out}$ and for providing a corresponding auxiliary output voltage $V_{aux-out}$ to comparator 214. For example, detector 212 may include a TSSI that measures the auxiliary power output $P_{aux-out}$ and provides a corresponding auxiliary output voltage $V_{aux-out}$ to comparator 214. Comparator 214 includes logic, code, and/or circuitry for comparing the auxiliary output voltage $V_{aux-out}$ to an auxiliary reference voltage $V_{aux-ref}$ and for determining a difference between the auxiliary output voltage $V_{aux-out}$ and the auxiliary reference voltage $V_{aux-ref}$. In some aspects, the auxiliary reference voltage $V_{aux-ref}$ may be predetermined. In some aspects, the auxiliary reference voltage $V_{aux-ref}$ may specify an amount of voltage (or a scaled version of voltage) that the output signal $RF_{out}$ should have in order for the plurality of power amplifiers 202 to maintain their level of performance. Bias supply 216 includes logic, code, and/or circuitry for adjusting the bias voltage $V_b$ provided to auxiliary power amplifier 208 and the last stage of power amplifiers 202 (e.g., power amplifiers 202d, 202h, 202l, and 202p) based on the difference in voltage between the auxiliary output voltage $V_{aux\text{-}out}$ and the auxiliary reference voltage $V_{aux\text{-}ref}$. For example, if the auxiliary output voltage $V_{aux\text{-}out}$ is less than the auxiliary reference voltage $V_{aux\text{-}ref}$, then bias supply 216 may increase the bias voltage $V_b$ provided to auxiliary power amplifier 208 and the last stage of power amplifiers 202 so that the last stage of power amplifiers 202 can generate the output signal $RF_{out}$ such that its voltage substantially matches the auxiliary reference voltage $V_{aux\text{-}ref}$ (or a scaled version of the auxiliary reference voltage $V_{aux\text{-}ref}$).

According to various aspects of the subject technology, a power amplifier may be configured as a cascode amplifier, which may comprise two or more transistors. According to certain aspects, voltage swings (and therefore stress) may be evenly divided across multiple transistors so that not one particular transistor may be disproportionately stressed compared to other transistors, thereby enhancing the reliability of the cascode amplifier. Furthermore, feedback mechanisms may be provided to ensure that bias voltages provided to the transistors of the cascode amplifier may be adjusted in order for the cascode amplifier to generate a signal with a desired power.

Figure 3A:
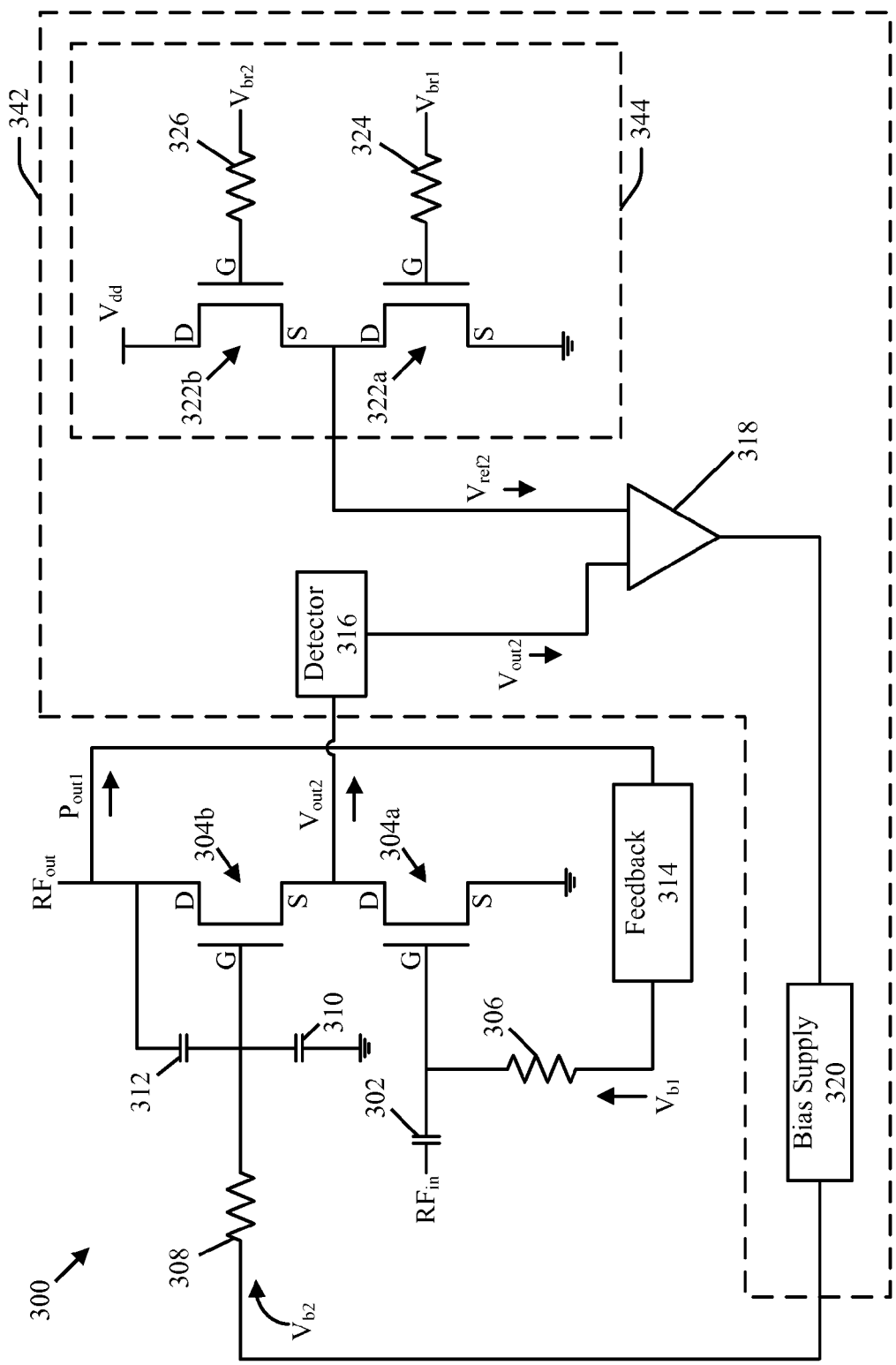
FIG. 3A illustrates an example of a cascode amplifier having two primary transistors, in accordance with various aspects of the subject technology.

FIG. 3A illustrates an example of cascode amplifier 300, in accordance with various aspects of the subject technology. Cascode amplifier 300 includes primary transistor 304a having a gate terminal G, a drain terminal D, and a source terminal S. The source terminal S of primary transistor 304a is coupled to ground. The gate terminal G of primary transistor 304a receives the signal $RF_{in}$ as well as a first bias voltage $V_{b1}$. Capacitor 302 may be used to prevent direct current from being received at the gate terminal G of primary transistor 304a. Resistor 306 may be used for biasing the gate terminal G of primary transistor 304a.

Cascode amplifier 300 also includes primary transistor 304b having a gate terminal G, a drain terminal D, and a source terminal S. The source terminal S of primary transistor 304b is coupled to the drain terminal D of primary transistor 304a. The gate terminal G of primary transistor 304b receives a second bias voltage $V_{b2}$. Resistor 308 may be used for biasing the gate terminal G of primary transistor 304b. Although primary transistors 304a and 304b are described as being field-effect transistors, it is understood that cascode amplifier 300 can include any other transistors for amplifying a signal, such as bipolar junction transistors.

According to certain aspects, the signal $RF_{in}$ is amplified at the drain terminal D of primary transistor 304b based on the first bias voltage $V_{b1}$ and the second bias voltage $V_{b2}$, thereby generating the output signal $RF_{out}$. According to certain aspects, the voltage swing of the output signal $RF_{out}$ may be evenly divided across primary transistors 304a and 304b, thereby preventing either of these transistors from disproportionately experiencing more stress and more aging than the other transistor. In one or more implementations, if the voltage swing of the output signal $RF_{out}$ is represented by 2×, then each of primary transistors 304a and 304b may encounter a voltage swing of 1×.

According to certain aspects, capacitors may be provided to distribute the voltage swing (and stress) evenly across primary transistors 304a and 304b. In one or more implementations, cascode amplifier 300 includes capacitor 310 coupled to the gate terminal G of primary transistor 304b and ground. Cascode amplifier 300 also includes capacitor 312 coupled to the gate terminal G of primary transistor 304b and the drain terminal D of primary transistor 304b. A magnitude of capacitor 310 and a magnitude of capacitor 312 may be selected such that the voltage swing of the output signal $RF_{out}$ at the drain terminal D of primary transistor 304b is substantially evenly divided across primary transistors 304a and 304b.

According to various aspects of the subject technology, feedback mechanisms may be provided to ensure that the first bias voltage $V_{b1}$ provided to primary transistor 304a and the second bias voltage $V_{b2}$ provided to primary transistor 304b may be adjusted in order to account for aging and/or for cascode amplifier 300 to generate the output signal $RF_{out}$ at a desired power. According to certain aspects, feedback module 314 may be used to detect a first power output $P_{out1}$ of the output signal $RF_{out}$, compare a corresponding first output voltage $V_{out1}$ (not shown) to a first reference voltage, and adjust the first bias voltage $V_{b1}$ based on the comparison. In one or more implementations, feedback module 314 may monitor for any change in performance of cascode amplifier 300 (e.g., monitor for a decrease in the first power output $P_{out1}$) and adjust the first bias voltage $V_{b1}$ as needed in order to account for any degradation in performance (e.g., increase the first bias voltage $V_{b1}$). In some aspects, feedback module 314 may be feedback module 116 described with respect to FIG. 1. In some aspects, feedback module 314 may be feedback module 218 described with respect to FIG. 2 (e.g., the input to feedback module 314 would then be a scaled version of $RF_{in}$ rather than the first power output $P_{out1}$ of the output signal $RF_{out}$).

Feedback module 342 may also be used to detect a second output voltage $V_{out2}$ at the source terminal S of primary transistor 304b, compare the second output voltage $V_{out2}$ to a second reference voltage $V_{ref2}$, and adjust the second bias voltage $V_{b2}$ based on the comparison. In one or more implementations, feedback module 342 may monitor for any change in voltage distribution across cascode amplifier 300 (e.g., monitor for a decrease in the second output voltage $V_{out2}$) and adjust the second bias voltage $V_{b2}$ as needed in order to account for any deviation from a desired voltage distribution (e.g., increase the second bias voltage $V_{b2}$).

According to certain aspects, feedback module 342 includes detector 316, reference voltage module 344, comparator 318, and bias supply 320. Detector 316 includes logic, code, and/or circuitry for measuring the second output voltage $V_{out2}$ and for providing this output voltage $V_{out2}$ to comparator 318. In one or more implementations, detector 316 may obtain only a direct current (DC) component of the output at the source terminal S of primary transistor 304b. In some aspects, reference voltage module 344 provides the second reference voltage $V_{ref2}$ to comparator 318. Comparator 318 includes logic, code, and/or circuitry for comparing the second output voltage $V_{out2}$ to the second reference voltage $V_{ref2}$ and for determining a difference between the second output voltage $V_{out2}$ and the second reference voltage $V_{ref2}$. In some aspects, the second reference voltage $V_{ref2}$ may specify a voltage that the second output voltage $V_{out2}$ should be in order to maintain a desired voltage distribution across cascode amplifier 300. Bias supply 320 includes logic, code, and/or circuitry for adjusting the second bias voltage $V_{b2}$ provided to primary transistor 304b based on the difference in voltage between the second output voltage $V_{out2}$ and the second reference voltage $V_{ref2}$. For example, if the second output voltage $V_{out2}$ is less than the second reference voltage $V_{ref2}$, then bias supply 320 may increase the second bias voltage $V_{b2}$ provided to primary transistor 304b so that the second output voltage $V_{out2}$ substantially matches the second reference voltage $V_{ref2}$.

According to certain aspects, reference voltage module 344 provides a circuit that is similar to cascode amplifier 300 but does not receive the signal $RF_{in}$ (and therefore does not age like cascode amplifier 300). Reference voltage module 344 includes auxiliary transistor 322a (e.g., similar to primary transistor 304a) having a gate terminal G, a drain terminal D, and a source terminal S. Similar to primary transistor 304a, the gate terminal G of auxiliary transistor 322a receives a first bias reference voltage $V_{br1}$. However, unlike primary transistor 304a, the gate terminal G of auxiliary transistor 322a does not receive the signal $RF_{in}$. Resistor 324 may be used for biasing the gate terminal G of auxiliary transistor 322a. In some aspects, resistor 324 may substantially match resistor 306. Similar to primary transistor 304a, the source terminal S of auxiliary transistor 322a is coupled to ground.

Reference voltage module 344 also includes auxiliary transistor 322b (e.g., similar to primary transistor 304b) having a gate terminal G, a drain terminal D, and a source terminal S. Similar to primary transistor 304b, the gate terminal G of auxiliary transistor 322b receives a second bias reference voltage $V_{br2}$. Resistor 326 may be used for biasing the gate terminal G of auxiliary transistor 322b. In some aspects, resistor 326 may substantially match resistor 308. Furthermore, the source terminal S of auxiliary transistor 322b is coupled to the drain terminal D of auxiliary transistor 322a. The drain terminal D of auxiliary transistor 322b receives a supply voltage $V_{dd}$ that may be substantially equal to a voltage across cascode amplifier 300 (e.g., voltage of the output signal $RF_{out}$). Since reference voltage module 344 is similar to cascode amplifier 300 except that reference voltage module 344 does not receive the signal $RF_{in}$ (and therefore does not age like cascode amplifier 300), the output voltage at the source terminal S of auxiliary transistor 322b (e.g., the second reference voltage $V_{ref2}$) may be reflective of what the second output voltage $V_{out2}$ would be if cascode amplifier 300 were not subjected to aging. In this regard, the second reference voltage $V_{ref2}$ may be compared to the second output voltage $V_{out2}$ to determine if the voltage distribution across primary transistors 304a and 304b has deviated from a desired voltage distribution.

According to certain aspects, the voltage distribution across auxiliary transistors 322a and 322b may be used as a reference that would enforce a similar voltage distribution across primary transistors 304a and 304b. For example, the second reference voltage $V_{ref2}$ may be adjusted to be half of the supply voltage $V_{dd}$ (e.g., the supply voltage $V_{dd}$ is distributed evenly across auxiliary transistors 322a and 322b). Auxiliary transistors 322a and 322b may each be diode connected in order to achieve such a voltage distribution (e.g., the first bias reference voltage $V_{br1}$ may be connected to the drain terminal D of auxiliary transistor 322a and the second bias reference voltage $V_{br2}$ may be connected to the drain terminal D of auxiliary transistor 322b). Since the second output voltage $V_{out2}$ is adjusted by the feedback mechanism of feedback module 342 to match the second reference voltage $V_{ref2}$, the voltage distribution across primary transistors 304a and 304b may be similar to the voltage distribution across auxiliary transistors 322a and 322b (e.g., the second output voltage $V_{out2}$ may be half of a voltage of the output signal $RF_{out}$).

Although reference voltage module 344 is described as providing a second reference voltage $V_{ref2}$ that can be adjusted, reference voltage module 344 may also include any code, logic, and/or circuitry for providing a second reference voltage $V_{ref2}$ that is predetermined. Furthermore, although cascode amplifier 300 is shown in FIG. 3A as having two primary transistors (e.g., primary transistors 304a and 304b) and reference voltage module 344 is shown as having two auxiliary transistors (e.g., auxiliary transistors 322a and 322b), it is understood that the feedback mechanisms described herein may be applied to any number of transistors in cascode amplifier 300 and/or in reference voltage module 344.

Figure 3B:
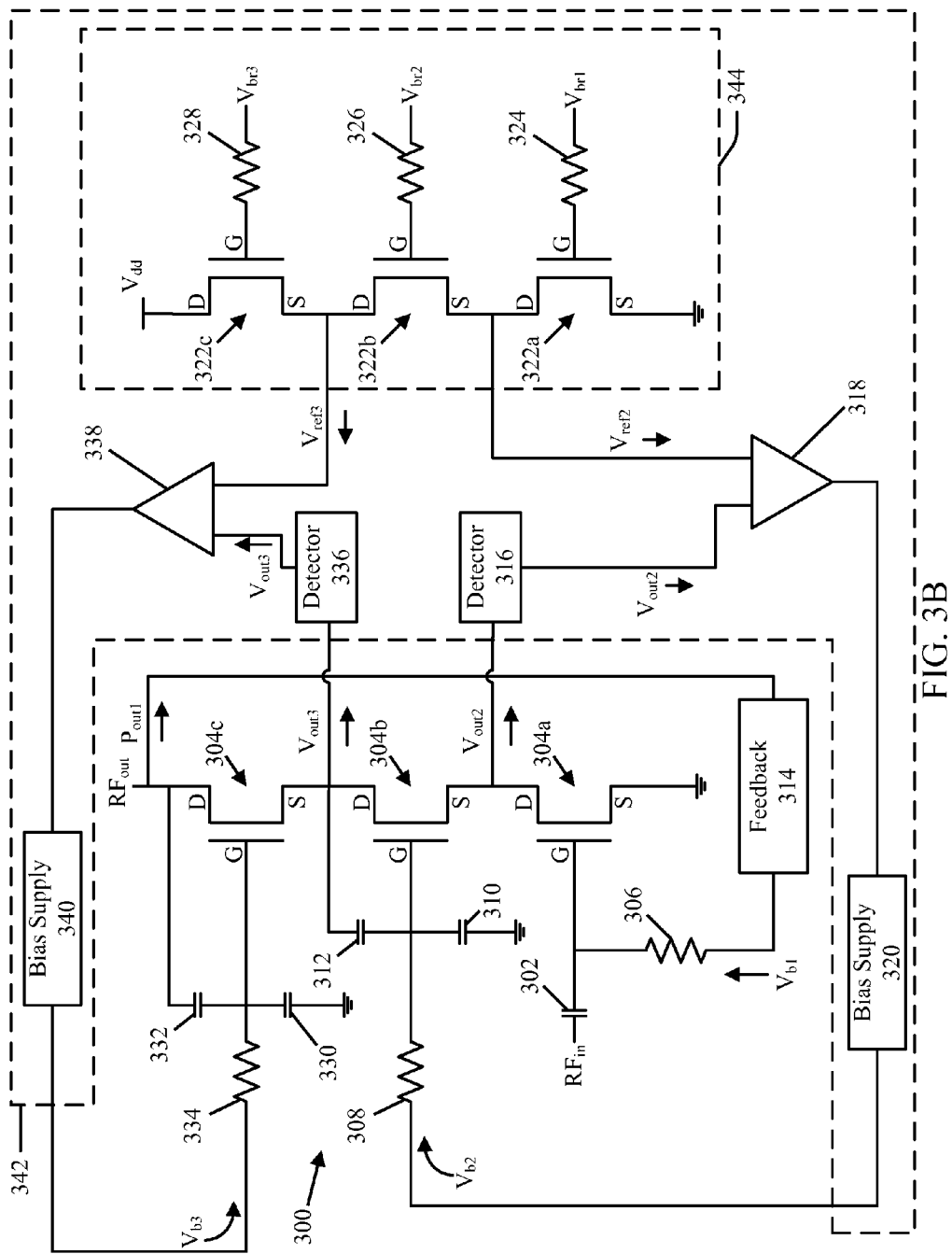
FIG. 3B illustrates an example of a cascode amplifier having three primary transistors, in accordance with various aspects of the subject technology.

FIG. 3B illustrates an example of cascode amplifier 300 having a third primary transistor (e.g., primary transistor 304c), in accordance with various aspects of the subject technology. Primary transistor 304c includes a gate terminal G, a drain terminal D, and a source terminal S. The source terminal S of primary transistor 304c is coupled to the drain terminal D of primary transistor 304b. The gate terminal G of primary transistor 304c receives a third bias voltage $V_{b3}$. Resistor 334 may be used for biasing the gate terminal G of primary transistor 304c.

According to certain aspects, the signal $RF_{in}$ is amplified at the drain terminal D of primary transistor 304c based on the first bias voltage $V_{b1}$, the second bias voltage $V_{b2}$, and the third bias voltage $V_{b3}$, thereby generating the output signal $RF_{out}$. According to certain aspects, the voltage swing of the output signal $RF_{out}$ may be evenly divided across primary transistors 304a, 304b, and 304c, thereby preventing any one of these transistors from disproportionately experiencing more stress and more aging than the other transistors. In one or more implementations, if the voltage swing of the output signal $RF_{out}$ is represented by 3×, then each of primary transistors 304a, 304b, and 304c may encounter a voltage swing of 1×.

In some aspects, capacitors may be provided to distribute the voltage swing (and stress) evenly across primary transistors 304a, 304b, and 304c. In one or more implementations, cascode amplifier 300 includes capacitor 330 coupled to the gate terminal G of primary transistor 304c and ground. Cascode amplifier 300 also includes capacitor 332 coupled to the gate terminal G of primary transistor 304c and the drain terminal D of primary transistor 304c. A magnitude of capacitor 310, a magnitude of capacitor 312, a magnitude of capacitor 330, and a magnitude of capacitor 332 may be selected such that the voltage swing of the output signal $RF_{out}$ at the drain terminal D of primary transistor 304c is substantially evenly divided across primary transistors 304a, 304b, and 304c.

Feedback module 342 may also be used to detect a third output voltage $V_{out3}$ at the source terminal S of primary transistor 304c, compare the third output voltage $V_{out3}$ to a third reference voltage $V_{ref3}$, and adjust the third bias voltage $V_{b3}$ based on the comparison. In one or more implementations, feedback module 342 may monitor for any change in voltage distribution across cascode amplifier 300 (e.g., monitor for a decrease in the third output voltage $V_{out3}$ and/or the second output voltage $V_{out2}$) and adjust the third bias voltage $V_{b3}$ and/or the second bias voltage $V_{b2}$ as needed in order to account for any deviation from a desired voltage distribution (e.g., increase the third bias voltage $V_{b3}$ and/or the second bias voltage $V_{b2}$).

According to certain aspects, feedback module 342 further includes detector 336, comparator 338, and bias supply 340. Detector 336 includes logic, code, and/or circuitry for measuring the third output voltage $V_{out3}$ and for providing this output voltage $V_{out3}$ to comparator 338. In one or more implementations, detector 338 may obtain only a DC component of the output at the source terminal S of primary transistor 304c. In some aspects, reference voltage module 344 provides the third reference voltage $V_{ref3}$ to comparator 338. Comparator 338 includes logic, code, and/or circuitry for comparing the third output voltage $V_{out3}$ to the third reference voltage $V_{ref3}$ and for determining a difference between the third output voltage $V_{out3}$ and the third reference voltage $V_{ref3}$. In some aspects, the third reference voltage $V_{ref3}$ may specify a voltage that the third output voltage $V_{out3}$ should be in order to maintain a desired voltage distribution across cascode amplifier 300. Bias supply 340 includes logic, code, and/or circuitry for adjusting the third bias voltage $V_{b3}$ provided to primary transistor 304c based on the difference in voltage between the third output voltage $V_{out3}$ and the third reference voltage $V_{ref3}$. For example, if the third output voltage $V_{out3}$ is less than the third reference voltage $V_{ref3}$, then bias supply 340 may increase the third bias voltage $V_{b3}$ provided to primary transistor 304c so that the third output voltage $V_{out3}$ substantially matches the third reference voltage $V_{ref3}$.

According to certain aspects, reference voltage module 344 further includes auxiliary transistor 322c (e.g., similar to primary transistor 304c) having a gate terminal G, a drain terminal D, and a source terminal S. Similar to primary transistor 304c, the gate terminal G of auxiliary transistor 322c receives a third bias reference voltage $V_{br3}$. Resistor 328 may be used for biasing the gate terminal G of auxiliary transistor 322c. In some aspects, resistor 328 may substantially match resistor 334. Furthermore, the source terminal S of auxiliary transistor 322c is coupled to the drain terminal D of auxiliary transistor 322b. The drain terminal D of auxiliary transistor 322c receives a supply voltage $V_{dd}$ that may be substantially equal to a voltage across cascode amplifier 300 (e.g., voltage of the output signal $RF_{out}$). Since reference voltage module 344 is similar to cascode amplifier 300 except that reference voltage module 344 does not receive the signal $RF_{in}$ (and therefore does not age like cascode amplifier 300), the output voltage at the source terminal S of auxiliary transistor 322c (e.g., the third reference voltage $V_{ref3}$) may be reflective of what the third output voltage $V_{out3}$ would be if cascode amplifier 300 were not subjected to aging. In this regard, the third reference voltage $V_{ref3}$ may be compared to the third output voltage $V_{out3}$ to determine if the voltage distribution across primary transistors 304a, 304b, and 304c has deviated from a desired voltage distribution.

According to certain aspects, the voltage distribution across auxiliary transistors 322a, 322b, and 322c may be used as a reference that would enforce a similar voltage distribution across primary transistors 304a, 304b, and 304c. For example, the third reference voltage $V_{ref3}$ may be adjusted to be ⅔ of the supply voltage $V_{dd}$ and the second reference voltage $V_{ref2}$ may be adjusted to be ⅓ of the supply voltage $V_{dd}$ (e.g., the supply voltage $V_{dd}$ is distributed evenly across auxiliary transistors 322a, 322b, and 322c). Auxiliary transistors 322a, 322b, and 322c may each be diode connected in order to achieve such a voltage distribution (e.g., the first bias reference voltage $V_{br1}$ may be connected to the drain terminal D of auxiliary transistor 322a, the second bias reference voltage $V_{br2}$ may be connected to the drain terminal D of auxiliary transistor 322b, and the third bias reference voltage $V_{br3}$ may be connected to the drain terminal D of auxiliary transistor 322c). Since the second output voltage $V_{out2}$ and the third output voltage $V_{out3}$ are adjusted by the feedback mechanism of feedback module 342 to match the second reference voltage $V_{ref2}$ and the third reference voltage $V_{ref3}$, respectively, the voltage distribution across primary transistors 304a, 304b, and 304c may be similar to the voltage distribution across auxiliary transistors 322a, 322b, and 322c (e.g., the third output voltage $V_{out3}$ may be ⅔ of a voltage of the output signal $RF_{out}$ and the second output voltage $V_{out2}$ may be ⅓ of a voltage of the output signal $RF_{out}$). Although reference voltage module 344 is described as providing a third reference voltage $V_{ref3}$ that can be adjusted, reference voltage module 344 may also include any code, logic, and/or circuitry for providing a third reference voltage $V_{ref3}$ that is predetermined.

Figure 4:
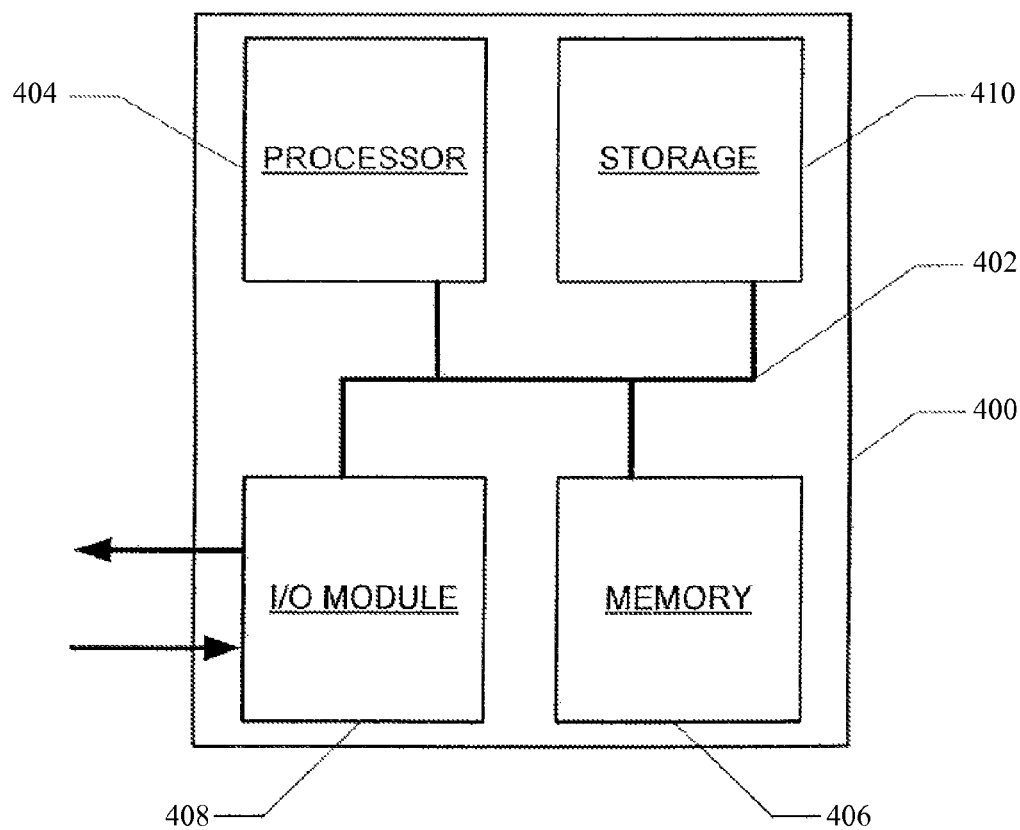
FIG. 4 is a block diagram illustrating components of a controller, in accordance with various aspects of the subject technology.

FIG. 4 is a block diagram illustrating components of controller 400, in accordance with various aspects of the subject technology. In one or more implementations, controller 400 may be used to implement, at least in part, the feedback mechanisms described herein to maintain power amplifier performance (e.g., determining an output voltage, receiving a reference voltage (e.g., a predetermined reference voltage), storing the reference voltage, comparing the output voltage to the reference voltage, determining how much a bias voltage should be adjusted based on the comparison, etc.). Controller 400 comprises processor module 404, storage module 410, input/output (I/O) module 408, memory module 406, and bus 402. Bus 402 may be any suitable communication mechanism for communicating information. Processor module 404, storage module 410, I/O module 408, and memory module 406 are coupled with bus 402 for communicating information between any of the modules of controller 400 and/or information between any module of controller 400 and a device external to controller 400. For example, information communicated between any of the modules of controller 400 may include instructions and/or data. In some aspects, bus 402 may be a universal serial bus. In some aspects, bus 402 may provide Ethernet connectivity.

In some aspects, processor module 404 may comprise one or more processors, where each processor may perform different functions or execute different instructions and/or processes. For example, one or more processors may execute instructions for maintaining power amplifier performance, and one or more processors may execute instructions for input/output functions.

Memory module 406 may be random access memory ("RAM") or other dynamic storage devices for storing information and instructions to be executed by processor module 404. Memory module 406 may also be used for storing temporary variables or other intermediate information during execution of instructions by processor 404. In some aspects, memory module 406 may comprise battery-powered static RAM, which stores information without requiring power to maintain the stored information. Storage module 410 may be a magnetic disk or optical disk and may also store information and instructions. In some aspects, storage module 410 may comprise hard disk storage or electronic memory storage (e.g., flash memory). In some aspects, memory module 406 and storage module 410 are both a machine-readable medium.

Controller 400 may be coupled via I/O module 408 to a user interface, which may allow a user to communicate information and select commands to controller 400 as well as receive information from controller 400. According to various aspects of the subject technology, methods described herein are executed by controller 400. Specifically, processor module 404 executes one or more sequences of instructions contained in memory module 406 and/or storage module 410. In one example, instructions may be read into memory module 406 from another machine-readable medium, such as storage module 410. In another example, instructions may be read directly into memory module 406 from I/O module 408, for example from an operator of system 100 via the user interface. Execution of the sequences of instructions contained in memory module 406 and/or storage module 410 causes processor module 404 to perform methods to maintain power amplifier performance. For example, a computational algorithm for maintaining power amplifier performance may be stored in memory module 406 and/or storage module 410 as one or more sequences of instructions. Information such as bias voltages, power outputs, output voltages, reference voltages, input signals, output signals, scale factors, and/or other information may be communicated from processor module 404 to memory module 406 and/or storage module 410 via bus 402 for storage. In some aspects, the information may be communicated from processor module 404, memory module 406, and/or storage module 410 to I/O module 408 via bus 402. The information may then be communicated from I/O module 408 to an operator of system 100 via the user interface.

One or more processors in a multi-processing arrangement may also be employed to execute the sequences of instructions contained in memory module 406 and/or storage module 410. In some aspects, hard-wired circuitry may be used in place of or in combination with software instructions to implement various aspects of the subject technology. Thus, aspects of the subject technology are not limited to any specific combination of hardware circuitry and software.

The term "machine-readable medium," or "computer-readable medium," as used herein, refers to any medium that participates in providing instructions to processor module 404 for execution. Such a medium may take many forms, including, but not limited to, non-volatile media and volatile media. Non-volatile media include, for example, optical or magnetic disks, such as storage module 410. Volatile media include dynamic memory, such as memory module 406. Common forms of machine-readable media or computer-readable media include, for example, floppy disk, a flexible disk, hard disk, magnetic tape, any other magnetic medium, a CD-ROM, DVD, any other optical medium, punch cards, paper tape, any other physical mediums with patterns of holes, a RAM, a PROM, an EPROM, a FLASH EPROM, any other memory chip or cartridge, or any other medium from which a processor can read.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to analyze and control an operation or a component may also mean the processor being programmed to analyze and control the operation or the processor being operable to analyze and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A system for maintaining power amplifier performance, the system comprising:
   a bias supply configured to generate a bias voltage;
   at least one primary power amplifier (PA) configured to receive the bias voltage and a primary radio frequency (RF) input, the at least one primary PA configured to amplify the primary RF input based on the bias voltage;
   an auxiliary PA connected in parallel with the at least one primary PA, the auxiliary PA being configured to receive the bias voltage and an auxiliary RF input, the auxiliary RF input being a scaled version of the primary RF input by a scale factor, the auxiliary PA being configured to amplify the auxiliary RF input based on the bias voltage;
   a detector configured to measure an output voltage associated with the amplified auxiliary RF input; and
   a comparator configured to compare the measured output voltage to a reference voltage,
   wherein the bias supply is configured to adjust the bias voltage provided to the auxiliary PA and the at least one primary PA based on the comparison of the measured output voltage to the reference voltage.

2. The system of claim 1, wherein the reference voltage is predetermined.

3. The system of claim 1, wherein a magnitude of the auxiliary RF input is less than a magnitude of the primary RF input.

4. The system of claim 1, wherein the scale factor is given by:
   $1/N$,
   where N is a total number of the at least one primary PA.

5. The system of claim 1, wherein the auxiliary PA is a scaled version of the at least one primary PA by an amplifier factor M, and wherein the scale factor is given by
   $M/N$,
   wherein N is a total number of the at least one primary PA, and
   wherein M is less than 1.

6. The system of claim 1, wherein the auxiliary PA is coupled to an auxiliary output load.

7. The system of claim 1, wherein the detector is coupled to an auxiliary output load.

8. A method for maintaining power amplifier performance, the method comprising:
   generating a bias voltage;
   receiving, by at least one primary power amplifier (PA), the bias voltage and a primary radio frequency (RF) input;
   amplifying, by the at least one primary PA, the primary RF input based on the bias voltage;
   receiving, by an auxiliary PA connected in parallel with the at least one primary PA, the bias voltage and an auxiliary RF input, the auxiliary RF input being a scaled version of the primary RF input by a scale factor;
   amplifying, by the auxiliary PA, the auxiliary RF input based on the bias voltage;
   measuring an output voltage associated with the amplified auxiliary RF input;
   comparing the measured output voltage to a reference voltage; and
   adjusting the bias voltage provided to the auxiliary PA and the at least one primary PA based on the comparison of the measured output voltage to the reference voltage.

9. The method of claim 8, wherein the scale factor is given by:
   $1/N$,
   where N is a total number of the at least one primary PA.

10. The method of claim 8, wherein the bias voltage is adjusted such that the measured voltage is substantially the same as the reference voltage.

11. The method of claim 8, wherein the reference voltage is predetermined.

12. The method of claim 8, wherein a magnitude of the auxiliary RF input is less than a magnitude of the primary RF input.

13. The method of claim 8, wherein the auxiliary PA is a scaled version of the at least one primary PA by an amplifier factor M, and wherein the scale factor is given by
    $M/N$,
    wherein N is a total number of the at least one primary PA, and
    wherein M is less than 1.

14. The method of claim 8, wherein the auxiliary PA is coupled to an auxiliary output load.

15. An apparatus comprising:
    a primary power amplifier (PA) configured to receive a bias voltage and a primary radio frequency (RF) input and amplify the primary RF input based on the bias voltage;
    an auxiliary PA configured to receive the bias voltage and an auxiliary RF input and amplify the auxiliary RF input based on the bias voltage, wherein the auxiliary RF input is a scaled version of the primary RF input by a scale factor;
    a comparator configured to compare a measured output voltage associated with the amplified auxiliary RF input to a reference voltage; and
    a bias supply configured to adjust the bias voltage provided to the auxiliary PA and the primary PA based at least in part on the comparison of the measured output voltage to the reference voltage.

16. The apparatus of claim 15, wherein a magnitude of the auxiliary RF input is less than a magnitude of the primary RF input.

17. The apparatus of claim 16, wherein the reference voltage is predetermined.

18. The apparatus of claim 17, wherein the auxiliary PA is coupled to an auxiliary output load.

19. The apparatus of claim 18, further comprising a detector configured to provide the measured output voltage to the comparator.

20. The apparatus of claim 19, further comprising an auxiliary output load coupled to the detector.

* * * * *